United States Patent [19]
Kosugi

[11] Patent Number: 6,116,792
[45] Date of Patent: Sep. 12, 2000

[54] SEMICONDUCTOR LASER MODULE

[75] Inventor: Tomonari Kosugi, Tokyo, Japan

[73] Assignee: NEC Corporation, Tokyo, Japan

[21] Appl. No.: 09/176,672

[22] Filed: Oct. 21, 1998

[30] Foreign Application Priority Data

Oct. 24, 1997 [JP] Japan .................................. 9-292594

[51] Int. Cl.$^7$ .................................................. G02B 6/36
[52] U.S. Cl. .......................................................... 385/92
[58] Field of Search ............................... 385/88–95, 147; 372/34, 43

[56] References Cited

U.S. PATENT DOCUMENTS

| | | | |
|---|---|---|---|
| 5,848,210 | 12/1998 | Kimura | 385/89 |
| 5,974,065 | 10/1999 | Kanda | 372/43 |

FOREIGN PATENT DOCUMENTS

| | | |
|---|---|---|
| 0763760 | 3/1997 | European Pat. Off. . |
| 0766107 | 4/1997 | European Pat. Off. . |
| 0800243 | 10/1997 | European Pat. Off. . |
| 5-8511 | 2/1993 | Japan . |
| 5-55710 | 3/1993 | Japan . |
| 5-315696 | 11/1993 | Japan . |
| 6-169133 | 6/1994 | Japan . |
| 7-131106 | 5/1995 | Japan . |
| 9-251120 | 9/1997 | Japan . |
| 9-269439 | 10/1997 | Japan . |
| 1-243488 | 9/1998 | Japan . |

*Primary Examiner*—Akm E. Ullah

[57] ABSTRACT

In a semiconductor laser module (10) in which the upper surface of a base board (14) comprises two surfaces, one surface acting as the upper surface of a lens mount portion (14b) onto which a lens (16) is fixed by YAG laser welding, and the other surface acting as the upper surface of a laser mount portion (14a), the upper surface of the lens mount portion (14b) being set to be lower in height than the upper surface of the laser mount portion (14a) by the length corresponding to the radius of the lens (16), the lens mount portion (14b) comprises upper and lower layer portions (14u, 14d) formed of materials which are different in thermal conductivity, and the lower layer portion (14d) is formed of the same material as the laser mount portion (14a) of the base board (14). The material of the upper layer portion (14u) of the lens mount portion (14b) is lower in thermal conductivity than the material of the lower layer portion (14d). The upper layer portion (14u) may be formed of iron-nickel-cobalt alloy, and the lower layer portion (14d) may be formed of copper-tungsten alloy.

6 Claims, 2 Drawing Sheets

SEMICONDUCTOR LASER MODULE

BACKGROUND OF THE INVENTION

1. Field of the Invention

The present invention relates to a semiconductor laser module having a temperature adjustment function which is used in an optical communication, optical information processing, etc.

2. Description of the Related Art

A semiconductor laser module has been widely used as a signal light source for an optical fiber transmission device or the like. Reduction in power consumption has been in progress for transmission devices using optical fibers, and with this progress, it has also been required to reduce the power consumption of circuit boards. Further, with this requirement, reduction in power consumption of various parts installed into circuit boards have been promoted. In connection with the reduction of the power consumption of various parts, particularly reduction in power consumption of semiconductor laser modules has been also required.

Japanese Utility Model Registration Application Laid-open No. Hei-5-8511, Japanese Patent Application Laid-open No. Hei-5-55710, Japanese Patent Application Laid-open No. Hei-5-315696, Japanese Patent Application Laid-open No. Hei-6-169133 and Japanese Patent Application Laid-open No. Hei-7-131106, etc. disclose various semiconductor laser modules which are applied to reduce the power consumption of the semiconductor laser modules. FIG. 1 shows a semiconductor laser module obtained by simplifying the conventional semiconductor laser modules as described above into a simple structure and illustrating it.

As shown in FIG. 1, one end of an optical fiber 32 for transmitting optical signals is accommodated in one side wall of a module package 31 of a semiconductor laser module 30. A temperature adjusting element 33 is disposed on the bottom surface of the inside of the module package 31, and a semiconductor laser 35 and a lens 36 for optically coupling a light beam emitted from the semiconductor laser 35 to the optical fiber 32 are disposed through a base board 34 on the temperature adjusting element 33.

In the semiconductor laser module 30 thus constructed, the following technique is used to reduce the power consumption thereof. The base board 34 on the temperature adjusting element 33 is preferably designed in a compact size, and the base board 34 is preferably formed of a material having a high thermal conductivity so that the temperature adjusting element 33 exhibits a desired cooling capability. However, a material which is not so high in thermal conductivity is used for the base board 36 because the lens 36 is fixed onto the base board 36 by a YAG laser welding method and heat radiation must be suppressed in the YAG laser welding process. That is, it is necessary that a material which is not so high in thermal conductivity is used for the base board 34 to fix the lens 36 onto the base board 34 by the YAG laser welding process although it is better that a material having a high thermal conductivity is used for the base board 34. Therefore, it has been hitherto unavoidable that materials which are not so high in thermal conductivity are used for the base board.

As described above, in the conventional semiconductor laser module structure, in order to reduce the power consumption, that is, enhance the cooling characteristic, materials which are suitable for the YAG laser welding process and are as high in thermal conductivity as possible are used for the base board 34. However, even when the material having the highest thermal conductivity among the materials that are suitable for the YAG laser welding process can be used for the base board 34 in order to improve the heat radiation of the base board 34 between the semiconductor laser 35 and the temperature adjusting element 33 for the lower power consumption, it is impossible to use materials which are higher in thermal conductivity but are not suitable for the YAG laser welding process.

SUMMARY OF THE INVENTION

An object of the present invention is to provide a semiconductor laser module which is more enhanced in cooling characteristic by improving the structure of constituent parts of the semiconductor laser module, particularly by improving the structure of a laser mount portion and a lens mount portion of a base board.

Therefore, in order to attain the above object, according to a first aspect of the present invention, there is provided a semiconductor laser module in which one end portion of an optical fiber is fixed to one side wall of a module package of the semiconductor laser module, a temperature adjusting element is fixed onto the bottom surface of the inside of the module package, a base board is fixed onto the upper surface of the temperature adjusting element, and the upper surface of the base board comprises two surfaces having a step therebetween, one surface acting as the upper surface of a lens mount portion on which YAG laser welding is conducted and the other surface acting as the upper surface of a laser mount portion, and the height of the upper surface of the lens mount portion is set to be lower than the height of the upper surface of the laser mount portion by the length corresponding to about the radius of a lens, wherein the lens mount portion of the base board comprises metal plates of an upper layer portion formed of material having a low thermal conductivity and a lower layer portion formed of material having a high thermal conductivity, and the lower layer portion is formed of the same material as the laser mount portion of the base board so as to be integral with the laser mount portion. The thermal conductivity of the lower layer portion is higher than that of the upper layer portion.

It is preferable that the upper layer portion of the lens mount portion is formed of alloy of iron-nickel-cobalt, and the lower layer portion of the lens mount portion is formed of alloy of copper-tungsten.

Further, the upper layer portion and the lower layer portion of the lens mount portion are preferably brazed to each other.

According to a second aspect of the present invention, there is provided a semiconductor laser module in which one end portion of an optical fiber is fixed to one side wall of a module package of the semiconductor laser module, a temperature adjusting element is fixed onto the bottom surface of the inside of the module package, a base board is fixed onto the upper surface of the temperature adjusting element, and the upper surface of the base board comprises two surfaces having a step therebetween, one surface acting as the upper surface of a lens mount portion on which YAG laser welding is conducted and the other surface acting as the upper surface of a laser mount portion, and the height of the upper surface of the lens mount portion is set to be lower than the height of the upper surface of the laser mount portion by the length corresponding to about the radius of a lens, wherein the lens mount portion of the base board is formed of a material whose thermal conductivity is lower than that of the laser mount portion of the base board.

The lens mount portion is preferably formed of alloy of iron-nickel-cobalt, and the laser mount portion is preferably formed of alloy of copper and tungsten.

The side surface of the lens mount portion is preferably brazed to the side surface of the laser mount portion.

DETAILED DESCRIPTION OF THE PREFERRED EMBODIMENTS

Preferred embodiments according to the present invention will be described hereinafter with reference to the accompanying drawings.

Figure 1:
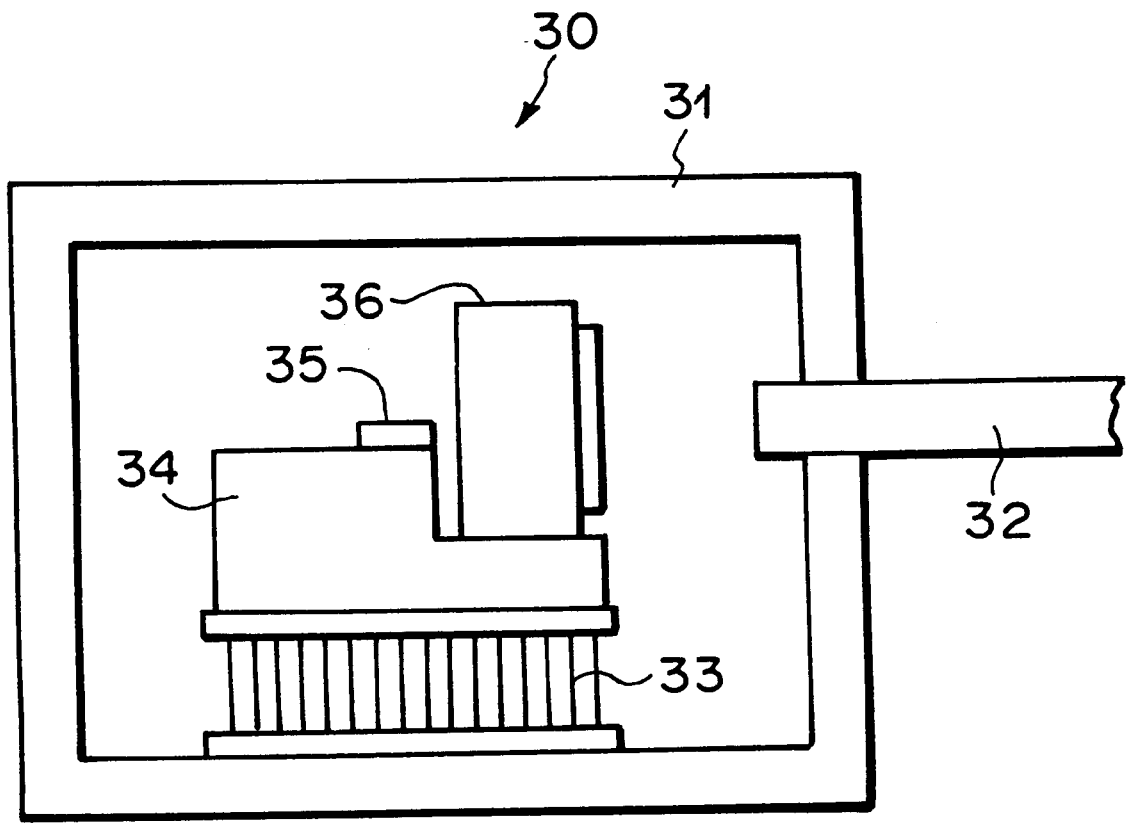
FIG. 1 is a diagram showing the structure of a conventional semiconductor laser module.
Figure 2:
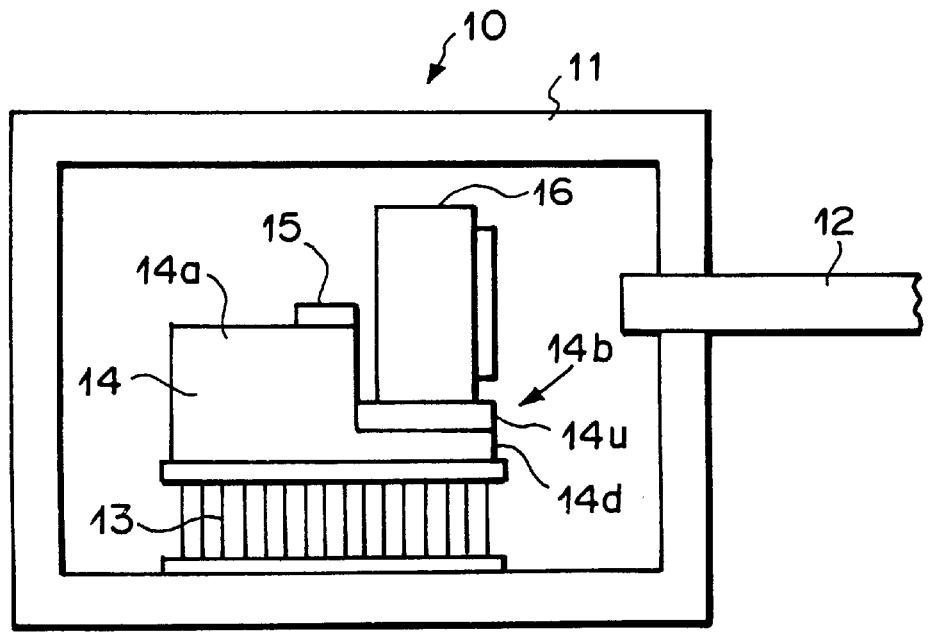
FIG. 2 is a diagram showing the structure of a first embodiment of a semiconductor laser module according to the present invention.

FIG. 2 is a diagram showing the structure of an embodiment of a semiconductor laser module of the present invention.

In the present invention, a semiconductor laser module which can enhance the cooling characteristic more remarkably than in the prior art by improving the structure of constituent parts. In FIG. 2, one end portion (a portion in the neighborhood of one end) of an optical fiber 12 is fixed to one side wall of a module package 11 of a semiconductor laser module 10. A temperature adjusting element 13 is fixed to the bottom surface of the inside of the module package 11. Further, the lower surface of a base board 14 comprising a metal plate is soldered to the upper surface of the temperature adjusting element 13.

The upper surface of the base board 14 comprises two flat surfaces having a step therebetween, and the upper surface of an upper layer portion 14u of a lens mount portion 14b is set to be lower in height than the upper surface of a laser mount portion 14a by the length corresponding to about the radius of a lens 16.

The laser mount portion 14a of the base board 14 and the lower layer portion 14d of the lens mount portion 14b of the base board are integrally formed of the same material. A semiconductor laser 15 is fixed to the end portion of the upper surface of the laser mount portion 14a of the base board 14. The lens mount portion 14b of the base board 14 comprises two metal plates formed by brazing upper and lower layer portions (14u, 14d) to each other, the upper and lower layer portions being formed of materials which are different in thermal conductivity. The lens 16 is fixed onto the upper surface of the upper layer portion 14u of the lens mount portion 14b of the base board 14 by YAG laser welding.

A material which is not so high in thermal conductivity is used for the YAG laser welding in order to suppress heat radiation in the YAG laser welding process. The lens mount portion 14b of the base board 14 comprises the two layers of the upper layer portion 14u formed of a material suitable for the YAG laser welding and the lower layer portion 14d formed of a material having a high thermal conductivity, the materials of the upper and lower layer portions 14u and 14d being different in thermal conductivity. Accordingly, a material having a high thermal conductivity which is not suitable for the YAG laser welding can be used for the lower layer portion 14d in the base board 14 between the semiconductor laser 15 and the temperature adjusting element (electronic cooling device) 13. Therefore, the cooling characteristic of the semiconductor laser module 10 can be more enhanced as compared with the conventional semiconductor laser module. In addition, the upper layer portion 14u of the base board 14 to which the lens 16 is fixed by the YAG laser welding can be formed of a material which is not so high in thermal conductivity and thus is suitable for the YAG laser welding, and thus the reliability of the YAG laser welding can be also more enhanced as compared with the conventional semiconductor laser module.

The first embodiment of the present invention will be described in more detail with reference to FIG. 2.

An end portion (a portion in the neighborhood of one end) of the optical fiber 12 for transmitting optical signals is fixed to one side wall of the module package 11 of the semiconductor laser module 10 by the YAG laser welding. The temperature adjusting element 13 comprising a Peltier element or the like is fixed to the bottom surface of the inside of the module package 11 by soldering. The lower surface of the base board 14, that is, the lower surfaces of the laser mount portion 14a and the lower layer portion 14d of the lens mount portion which are integrally formed with each other are fixed to the upper surface of the temperature adjusting element (electronic cooling element) 13.

The semiconductor laser 15 is soldered to the end portion of the upper surface of the laser mount portion 14a which is nearer to the optical fiber 12. The fixing position of the optical fiber 12 is predetermined so that the optical axis of the optical fiber 12 is coincident with the emission portion of the semiconductor laser 15 in height. The lens 16 is fixed to the upper surface of the upper layer portion 14u of the lens mount portion 14b of the base board 14 by the YAG laser welding.

In the semiconductor laser module 10 thus constructed, the semiconductor laser 15 and the optical fiber 12 are optically coupled to each other. Further, heat radiated by the semiconductor laser 15 is transmitted through the base board 14 to the temperature adjusting element 13 so that the the semiconductor laser 15 is kept in a predetermined temperature range.

In the semiconductor laser module 10 of this embodiment, the lens mount portion 14b of the base board 14 comprises the lower layer portion 14d formed of alloy of copper and tungsten (Cu—W) which is high in thermal conductivity, e.g. 230.0 W/(mK), and the upper layer portion 14u formed of alloy of iron-nickel-cobalt (Fe—Ni—Co) which is low in thermal conductivity, e.g. 16.8 W/(mK), and suitable for the YAG laser welding, the lower layer portion 14d and the upper layer portion 14u being coupled to each other by a brazing (soldering) material, and thus the portion of the base board 14 other than the upper layer portion 14u can be formed of a material which is as high in thermal conductivity as possible.

Accordingly, the heat-transmission in the base board 14 between the semiconductor laser 15 and the temperature adjusting element 13 to the lower side thereof is enhanced, and the power consumption of the temperature adjusting element can be reduced. As a result, the cooling characteristic of the semiconductor laser module 10 can be more enhanced as compared with the conventional semiconductor laser module. In addition, the upper layer portion 14u of the lens mount portion 14b of the base board 14 to which the lens 16 is fixed by the YAG laser welding may be formed of a material which is not so high in thermal conductivity and thus is suitable for the YAG laser welding. Therefore, the reliability of the YAG laser welding can be more enhanced as compared with the prior art.

In this embodiment, an example of the upper layer portion 14u of the lens mount portion 14b of the base board 14 is shown. The shape, position and thickness of the upper layer portion may be freely modified in accordance with the shape and size of various parts such as the base board 14 disposed on the temperature adjusting element 13, the lens 16 on the base board 14, etc.

Next, a second embodiment of the present invention will be described.

Figure 3:
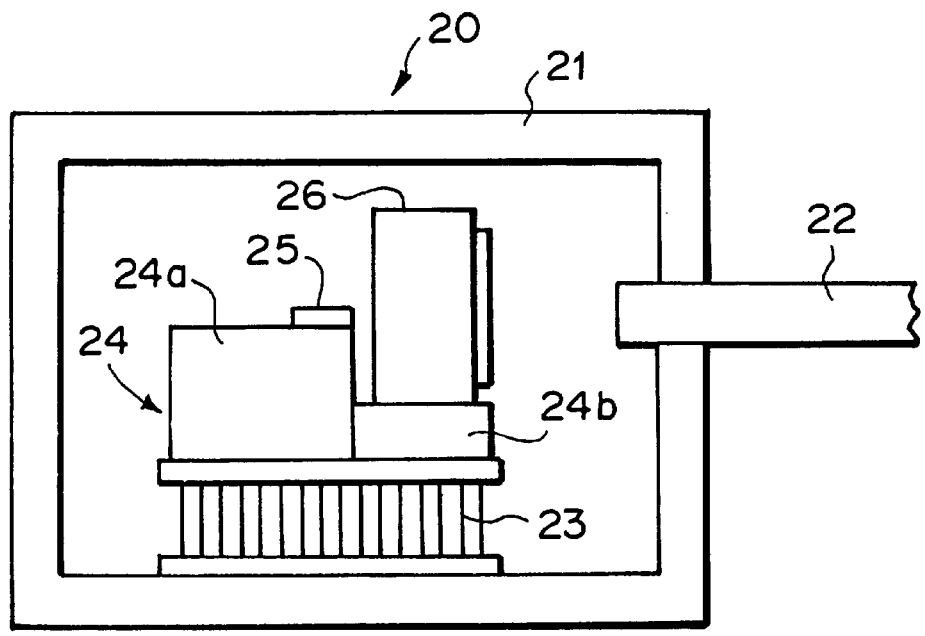
FIG. 3 is a diagram showing the structure of a second embodiment of a semiconductor laser module according to the present invention.

FIG. 3 shows the construction of the second embodiment.

As shown in FIG. 3, the step shape of the overall base board 24 of the second embodiment is the same as that of the base board 14 of the first embodiment. The difference between the second embodiment and the first embodiment resides in the structure of the laser mount portion 24a and the lens mount portion 24b. That is, the laser mount portion 24a itself has no step and its shape is simple rectangular parallelepiped. In addition, the lens mount portion 24b is constructed by one layer. The material of the laser mount portion 24a is high in thermal conductivity, and the material of the lens mount portion 24b is lower in thermal conductivity than that of the laser mount portion 24a.

The materials will be described although it is slightly duplicative description, the materials of the laser mount portion 24a and the lens mount portion 24b are similar to the materials of the laser mount portion 14a and the upper layer portion 14u of the lens mount portion 14b, respectively. The side end surfaces of these portions 24a and 24b are brazed (soldered) to each other.

Comparing the feature of the second embodiment with that of the first embodiment, there is no difference in the weldability between the lens and the base board, and the advantage of the first embodiment is kept in the second embodiment. The volume of the overall portion having the high thermal conductivity is reduced, and thus the heat radiation capability is slightly lowered. However, both the laser mount portion 24a and the lens mount portion 24b are simple in structure, and thus the manufacturing process is simpler. It is needless to say that the heat radiation performance is more remarkably excellent than that of the prior art.

Next, the second embodiment will be further described.

In the semiconductor laser module 20 of this embodiment, the base board 24 comprises a laser mount portion 24a formed of copper-tungsten (Cu—W) alloy which is high in thermal conductivity, and a lens mount portion 24b formed of iron-nickel-cobalt (Fe—Ni—Co) alloy which is lower in thermal conductivity than the laser mount portion 24a and is suitable for the YAG laser welding. The laser mount portion 24a and the lens mount portion 24b are disposed so that the bottom surfaces thereof are arranged on the same plane, and the side surfaces thereof are joined to each other by brazing material.

Accordingly, by forming the lens mount portion 24b of the base board 24 of material which is low in thermal conductivity, the high reliability of the welding between the lens and the base board can be kept. In addition, the laser mount portion 24b of the base board 24 can be formed of material which is as high in thermal conductivity as possible, and the manufacturing process becomes easier.

As described above, according to the first embodiment, the base board mounted on the temperature adjusting element is designed in the two-layered structure comprising the upper layer portion and the lower layer portion formed of materials which are different in thermal conductivity, and the lower surface of the lower layer portion is fixed to the upper surface of the temperature adjusting element. Therefore, in the prior art, the material of the base board has been hitherto limited to those materials which are suitable for the YAG laser welding, however, according to the present invention, materials which are high in thermal conductivity can be selected as the materials of the laser mount portion and the lower layer portion of the lens mount portion, so that the heat radiation of the base board, except for the upper layer portion of the lens mount portion thereof, can be enhanced.

Further, according to the second embodiment, the lens mount portion is formed of a layer which is not so high in thermal conductivity, and the laser mount portion is formed of material which is high in thermal conductivity and designed to have no step, thereby obtaining the total effect such as enhancement in weldability and heat radiation performance of the base board and reduction in manufacturing cost.

Accordingly, according to both the embodiments, the power consumption of the temperature adjusting element can be reduced, the power saving of the semiconductor laser module can be further promoted, and the cooling characteristic of the semiconductor laser module can be greatly enhanced. The reduction of the power consumption (power saving) can also contribute to the power saving of a transmitter in which the semiconductor laser module is mounted.

In addition, the selection of the material of the portion of the base board to which the lens is fixed by the YAG laser welding can be more properly performed, so that the reliability of the YAG laser welding is more greatly enhanced as compared with the prior art, and thus there can be provided a semiconductor laser module having a lower manufacturing cost.

What is claimed is:

1. A semiconductor laser module in which one end portion of an optical fiber is fixed to one side wall of a module package of the semiconductor laser module, a temperature adjusting element is fixed onto the bottom surface of the inside of said module package, a base board is fixed onto the upper surface of said temperature adjusting element, and the upper surface of said base board comprises two surfaces having a step therebetween, one surface acting as the upper surface of a lens mount portion on which a lens is fixed by YAG laser welding and the other surface acting as the upper surface of a laser mount portion, and the height of the upper surface of said lens mount portion is set to be lower than the height of the upper surface of said laser mount portion by the length corresponding to about the radius of a lens, characterized in that said lens mount portion of said base board comprises metal plates of an upper layer portion formed of material having a low thermal conductivity and a lower layer portion formed of material having a high thermal conductivity, and the lower layer portion is formed of the same material as said laser mount portion of said base board so as to be integral with said laser mount portion.

2. The semiconductor laser module as claimed in claim 1, wherein said upper layer portion of said lens mount portion is formed of alloy of iron-nickel-cobalt, and said lower layer portion of the lens mount portion is formed of alloy of copper-tungsten.

3. The semiconductor laser module as claimed in claim 1, wherein said upper layer portion and said lower layer portion of said lens mount portion are brazed to each other.

4. A semiconductor laser module in which one end portion of an optical fiber is fixed to one side wall of a module package of the semiconductor laser module, a temperature adjusting element is fixed onto the bottom surface of the inside of said module package, a base board is fixed onto the upper surface of said temperature adjusting element, and the upper surface of said base board comprises two surfaces having a step therebetween, one surface acting as the upper surface of a lens mount portion on which a lens is fixed by YAG laser welding and the other surface acting as the upper surface of a laser mount portion, and the height of the upper surface of said lens mount portion is set to be lower than the height of the upper surface of said laser mount portion by the length corresponding to about the radius of a lens, characterized in that said lens mount portion of said base board is formed of a material whose thermal conductivity is lower than that of said laser mount portion of the base board.

5. The semiconductor laser module as claimed in claim 4, wherein said lens mount portion is formed of alloy of iron-nickel-cobalt, and said laser mount portion is formed of alloy of copper and tungsten.

6. The semiconductor laser module as claimed in claim 4, wherein the side surface of said lens mount portion is brazed to the side surface of said laser mount portion.

* * * * *